United States Patent [19]
Zwick et al.

[11] Patent Number: 5,704,709
[45] Date of Patent: Jan. 6, 1998

[54] OPTICAL RECEIVING BODY FOR AT LEAST ONE LED

[75] Inventors: Hubert Zwick, Stuttgart; Hellfried Sandig, Esslingen, both of Germany

[73] Assignee: Reitter & Schefenacker GmbH & Co. KG, Esslingen, Germany

[21] Appl. No.: 702,314

[22] Filed: Aug. 23, 1996

[30] Foreign Application Priority Data

Aug. 25, 1995 [DE] Germany .................. 195 31 295.3

[51] Int. Cl.$^6$ .................. F21V 5/04; F21V 7/06
[52] U.S. Cl. .................. 362/304; 362/241; 362/245; 362/308; 362/309; 362/329; 362/800
[58] Field of Search .................. 362/61, 304, 230, 362/240, 241, 244, 245, 246, 247, 249, 299, 300, 302, 307, 308, 309, 311, 327, 329, 800

[56] References Cited

U.S. PATENT DOCUMENTS

| | | | |
|---|---|---|---|
| 4,254,453 | 3/1981 | Mouyard et al. | 362/240 |
| 4,271,408 | 6/1981 | Teshima et al. | 362/800 |
| 4,478,588 | 10/1984 | Lockard | 362/307 |
| 4,698,730 | 10/1987 | Sakai et al | 362/800 |
| 4,733,335 | 3/1988 | Serizawa et al. | 362/800 |
| 4,935,665 | 6/1990 | Murata | 362/800 |
| 4,975,814 | 12/1990 | Schairer | 362/800 |
| 5,140,220 | 8/1992 | Hasegawa | 362/800 |

*Primary Examiner*—Thomas M. Sember
*Attorney, Agent, or Firm*—Robert W. Becker & Associates

[57] ABSTRACT

The optical receiving body for at least one LED has an optical member with a receiving chamber for receiving the at least one LED. The LED emits light in a main direction of light emission. The receiving chamber has an inner wall with a parabolic wall section. The parabolic wall section is a first reflective surface for light beams emitted by the at least one LED. The exterior surface of the optical member is provided with at least one second reflective surface.

14 Claims, 4 Drawing Sheets

OPTICAL RECEIVING BODY FOR AT LEAST ONE LED

BACKGROUND OF THE INVENTION

The present invention relates to an optical receiving body for at least one LED comprising at least one reflective surface for reflecting the light emitted by the LED.

Such optical receiving bodies serve to reflect the light emitted by the LED into a predetermined direction of light emission. The LED is for this purpose embedded into an optical receiving body which is comprised of a transparent material. The light emitted by the LED reaches either the exterior side of the optical receiving body or its end face. At the exterior side of the optical receiving body the beams are reflected toward the end face. Upon exiting through the end face the light beams are refracted into the desired direction. The manufacture of such optical receiving bodies is quite complicated and, furthermore, the light efficiency of such devices is limited.

It is therefore an object of the present invention to provide an optical receiving body of the aforementioned kind that can be easily and inexpensively manufactured and ensures a high light efficiency of the light emitted by the LED.

SUMMARY OF THE INVENTION

The optical receiving body for at least one LED according to the present invention is primarily characterized by:

An optical member having a receiving chamber for receiving the at least one LED emitting light in a main direction of light emission;

The receiving chamber having an inner wall comprising a parabolic wall section;

The parabolic wall section being a first reflective surface for light beams emitted by the at least one LED.

Preferably, the light beams are partly refracted at the parabolic wall section to refracted light beams.

The optical member preferably has an end face extending perpendicularly to the main direction of light emission and the reflected light beams and the refracted light beams exit through the end face.

Preferably, the light beams penetrating the optical member are refracted upon passing through the end face.

Advantageously, the receiving chamber has an outlet opening for the light within the end face and the end face comprises at least one conical surface surrounding the outlet opening.

Advantageously, the optical member comprises at least one second reflective surface, wherein the refracted light beams impact on the at least one second reflective surface to be reflected in a main direction of light emission.

Expediently, the optical member has an exterior surface and the at least one second reflective surface is located at the exterior surface. The exterior surface is preferably at least partially metal-coated to form the at least one reflective surface.

Advantageously, a plurality of second reflective surfaces are arranged at the exterior surface one after another in an axial direction of the optical member.

Preferably, the at least one second reflective surface is conically shaped.

In another embodiment of the present invention the at least one second reflective surface is parabolically shaped.

In yet another embodiment of the present invention the at least one second reflective surface is free-formed.

In a further embodiment of the present invention the at least one second reflective surface is parabolically shaped and free-formed.

Of course, for a plurality of such second reflective surfaces may include a combination of any of the disclosed shapes.

Advantageously, the optical member is substantially cone-shaped and preferably widens in the main direction of light emission.

Advantageously, the optical member is comprised of a transparent material, preferably a plastic material.

In the inventive optical receiving body the LED is introduced into (mounted in) the receiving chamber of the optical member. In contrast to the prior art, it is not embedded in the optical member so that the manufacture of the optical receiving body is simplified and especially less expensive. The light emitted by the LED is reflected at the inner wall of the receiving chamber. The inner wall is embodied as a parabolic surface so that the ratio of inner diameter of the receiving chamber to the axial length of the parabolic surface can be very small. This results in an optimal use of the light emitted by the LED, i.e., optimized light efficiency. The inventive optical receiving body can be used as a light for a vehicle, especially for centrally mounted braking lights at the top of the vehicle. Depending on the length and/or height of the light it is possible to use a plurality of such optical receiving bodies in an arrangement horizontally and/or vertically adjacent to one another. The optical receiving body ensures an optimal illumination of the cover plate covering the light.

BRIEF DESCRIPTION OF THE DRAWINGS

The object and advantages of the present invention will appear more clearly from the following specification in conjunction with the accompanying drawings, in which.

DESCRIPTION OF PREFERRED EMBODIMENTS

The present invention will now be described in detail with the aid of several specific embodiments utilizing FIGS. 1 through 4.

Figure 1:
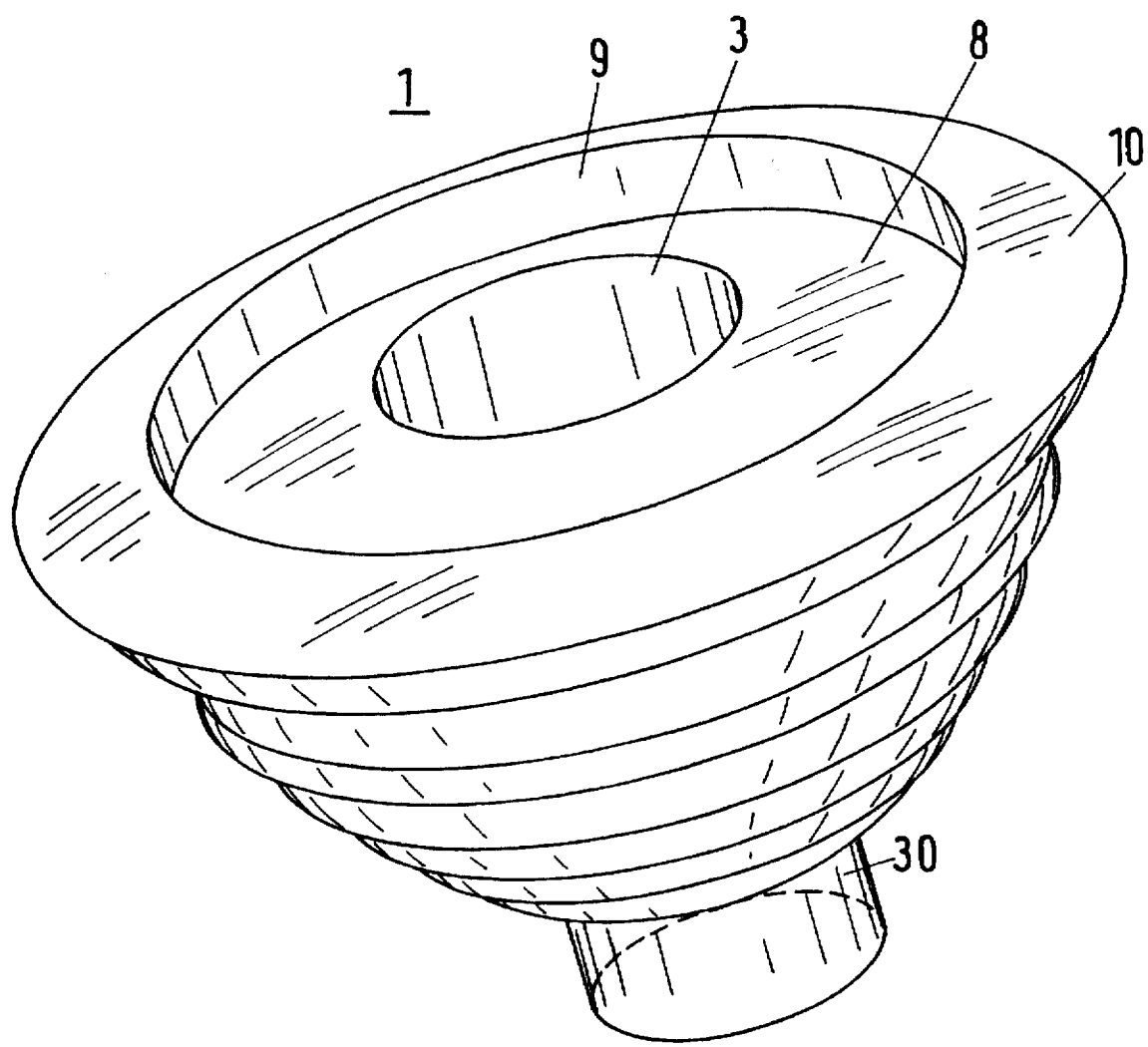
FIG. 1 is a perspective representation of the inventive optical receiving body in which one LED is positioned.
Figure 2:
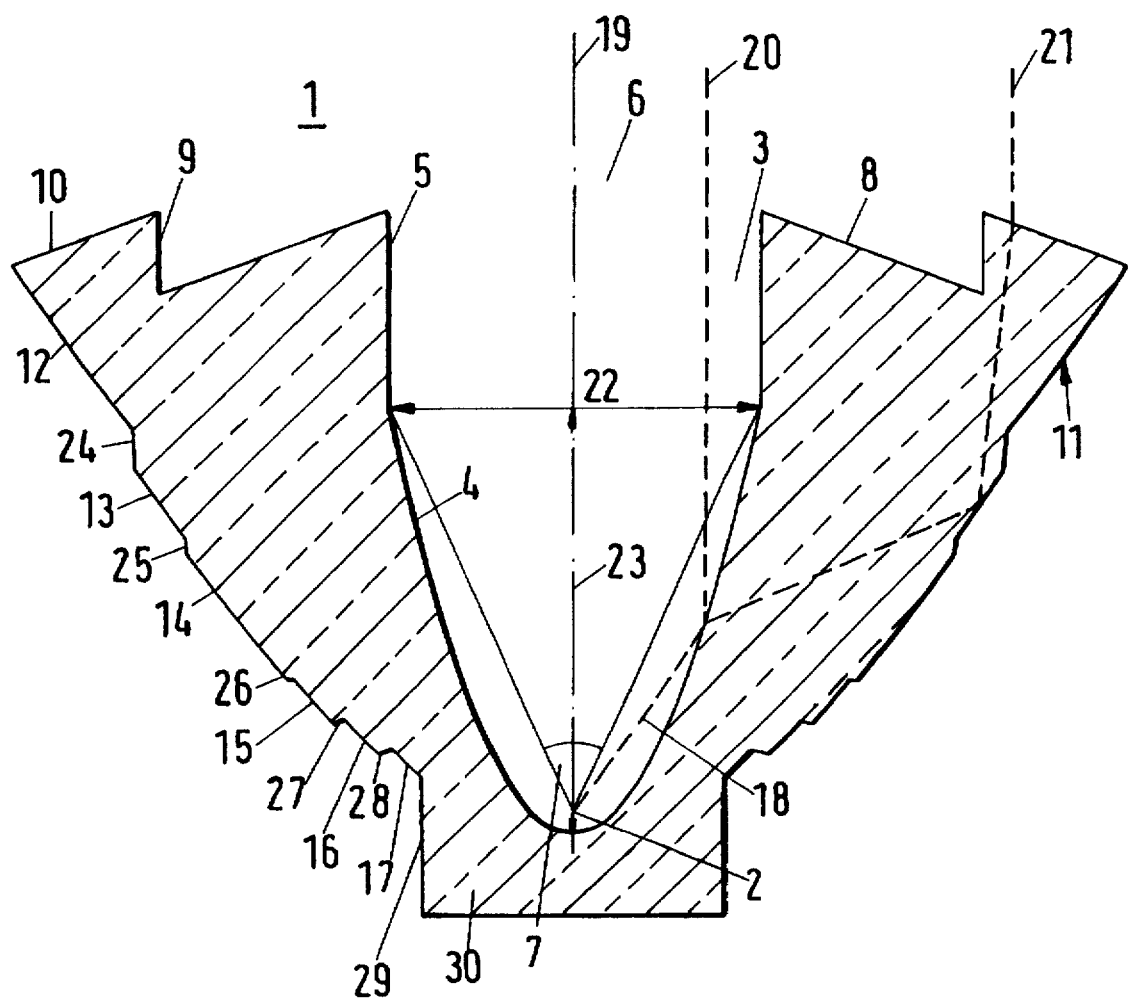
FIG. 2 shows an axial section of the optical receiving body according to FIG. 1.
Figure 3:
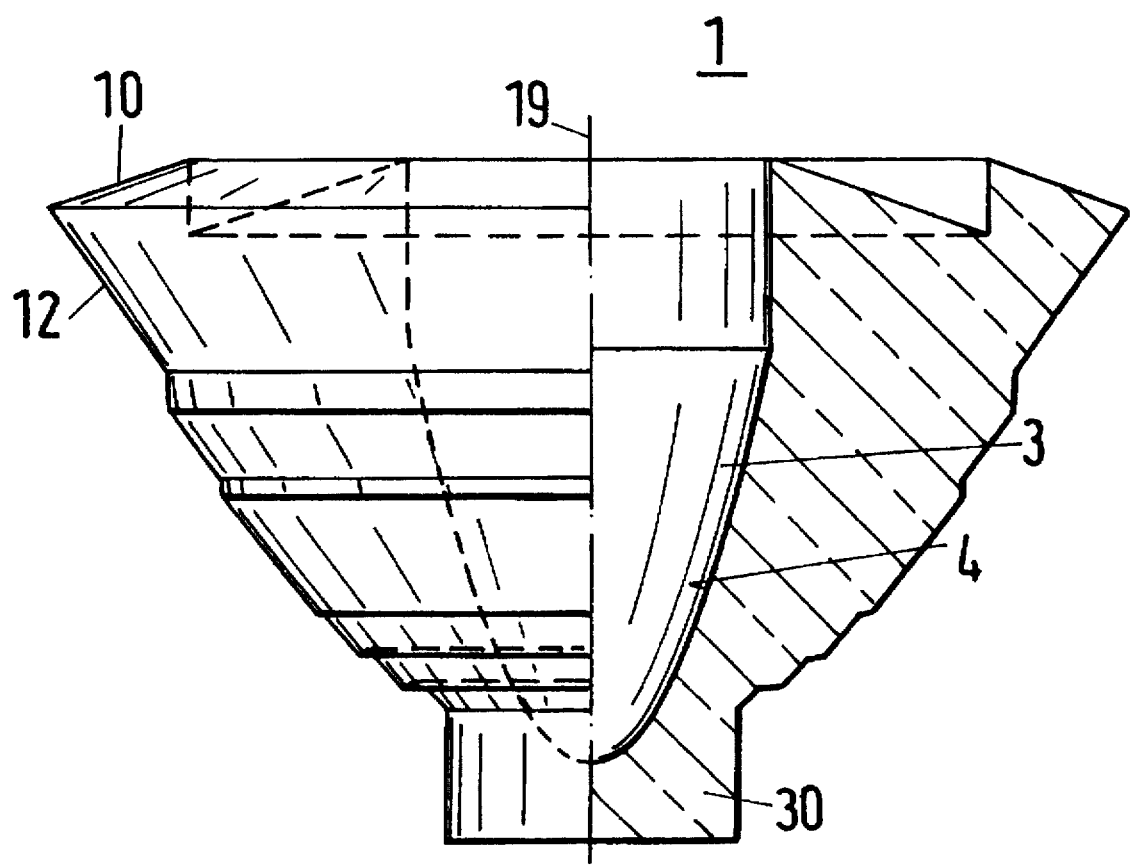
FIG. 3 shows the optical receiving body according to FIG. 1 partly in a side view and partly in axially section.

In the optical member 1 according to FIGS. 1 to 3 an LED 2, indicated schematically in FIG. 2, is arranged. The optical receiving body is designed such that a high percentage of the light emitted by the LED 2 is usable, i.e., the light efficiency is high.

The optical member 1 is a body of radial symmetry and has a central receiving chamber 3 in which the LED 2 is received. The receiving chamber 3 is delimited over a great portion in its axial length by a parabolic surface 4 to which is connected a cylindrical surface 5 which extends to the wide end face of the optical member 1. The receiving chamber 3 is open at the wide end face of the optical member 1 which provides a corresponding circular outlet opening 6 (FIG. 2) for allowing passage of at least a portion of the light emitted by the LED 2. The transition from the parabolic surface 4 into the cylindrical surface 5 is located, relative to the focal point of the parabolic surface where the LED 2 is arranged, at a cone angle 7 of approximately 50°. Of course, this cone angle 7 can vary depending on the depth of the receiving chamber 3 and/or its diameter. The transition from the parabolic surface 4 to the cylindrical surface 5 is selected such that a great portion of the light emitted by the LED 2 impacts the parabolic surface 4 and is reflected and refracted thereat in a manner which will be disclosed in the following.

The cylindrical surface 5 has a transition, at the wide end face of the optical member 1 comprising the outlet opening 6, into a conical surface 8 which in the radial direction has a downward slant and a transition into a cylindrical surface 9 having a radius that is greater than the radius of the cylindrical surface 5. The cylindrical surface 9 is positioned coaxially to the cylindrical surface 5, but has a smaller axial length. The cylindrical surface 9 has connected thereto a further conical surface 10 which also slants downwardly in the radial direction and extends to the exterior surface of the optical member 1. The two conical surfaces 8, 10 extend parallel to one another whereby the radially outwardly positioned conical surface 10 has a reduced radial length as compared to the inner conical surface 8. The two conical surfaces 8, 10 as well as the cylindrical surface 9 connecting them are positioned within the wide end face of the optical member 1 provided with the outlet opening 6.

The optical member 1 is comprised of a transparent material and is provided at the exterior surface 11 with a reflective coating which preferably is formed by metal-coating the exterior surface 11. The exterior surface 11 is divided into individual conically shaped reflective surfaces 12–17 which are positioned coaxially relative to one another. All of the reflective surfaces are, as shown in the representation according to FIG. 2, downwardly tapering conical surfaces. The radii of the conical surfaces 12 to 17 thus decrease from the end face 8–10 of the optical member 1 in the downward direction. Thus, the optical member 1 tapers away from the end face 8–10. At the individual reflective surfaces 12 to 17 the refracted light beams, emitted by the LED 2 and refracted at the parabolic surface 4, are reflected such that all light beams exit through the end face 8–10 of the optical member 1 preferably parallel to one another. As is shown schematically in FIG. 2, the light beam 18 emitted by the LED 2 is first reflected at the parabolic surface 4 so that it exits parallel to the axis 19 of the optical member 1 through the outlet opening 6. The light beam 18 is however also refracted at the parabolic surface 4 and thus penetrates the optical member 1 and impacts the reflective surface 13 of the exterior surface 11. At the reflective surface 13 the beam 18 is reflected toward the conical surface 10 where it is, upon passing therethrough, refracted in order to exit parallel to the axis 19 from the end face 8–10 of the optical member 1. The light beam 18 is thus divided into two parallel partial beams 20, 21. In this manner, all of the light beams emitted by the LED 2 are partly reflected at the parabolic surface 4 and partly refracted thereat. Depending on the impact angle of the light beam, the light beams refracted at the parabolic surface 4 impact on the reflective surfaces 12 to 17 at which they are reflected toward one of the conical surfaces 8, 10 of the end face. Here, the light beams are refracted in the aforedescribed manner upon passing through the end face so that the partial beams exit parallel to the axis 19.

The lateral reflective surfaces 12 to 17 are formed in the shown embodiment such that the light beams, after being refracted again at the end face, exit parallel to the axis 19. Of course, the reflective surfaces 12 to 17 and/or the end face with its conical surfaces 8, 10 can be shaped such that the light beams extend in a converging or diverging manner. Due to the aforementioned embodiment a large illuminated surface area 6 and 8 to 10 is produced at the optical member 1. A high percentage of the light emitted by the LED 2 is thus usable so that a high light efficiency is achieved.

The reflective surfaces 12 to 17 can also be in the shape of parabolic surfaces and/or free-formed surfaces. It is also possible to embody the respective reflective surfaces, depending on the application, as conical surfaces and/or parabolic surfaces and/or free-formed surfaces.

Depending on the angle at which the light beams emitted by the LED 2 impact the parabolic surface 4, the light beams are not refracted but simply reflected at the parabolic surface 4. The parabolic surface is then embodied such that the light is reflected in the desired manner.

The parabolic surface 4 has a very small ratio of opening diameter 22 to depth 23 (FIG. 2). The opening diameter 22 refers to the greatest diameter of the parabolic surface 4. Due to this small ratio, the light emitted by the LED 2 is optimally usable without the outlet opening 6 having too small a diameter or the parabolic surface 4 having too great an axial depth 23. Thus, the optical member 1 features a very compact design. Especially the exterior surface 11 is relatively small so that it can be treated, for example, by vapor deposition for producing a reflective coating (metal coating) of a high quality.

The reflective surface 12, connected to the conical surface 10 provided at the end face, has a transition into a conical surface 24 having a very small cone angle which, in turn, has a transition into the conical surface 13. The latter conical surface 13 is connected with a further axially very short conical surface 25 to the reflective surface 14. The latter is connected with another axially very short conical surface 26 to the reflective surface 15. The reflective surface 15 has a transition into a further conical surface 27 which, in turn, has a transition into the reflective surface 16 that is connected with a conical surface 28 to the reflective surface 17. The latter has a transition into a cylindrical surface 29 which is the mantle surface of a projection 30 of the optical member 1. The cylindrical surface 29 has no reflective properties and is not metal-coated.

Figure 4:
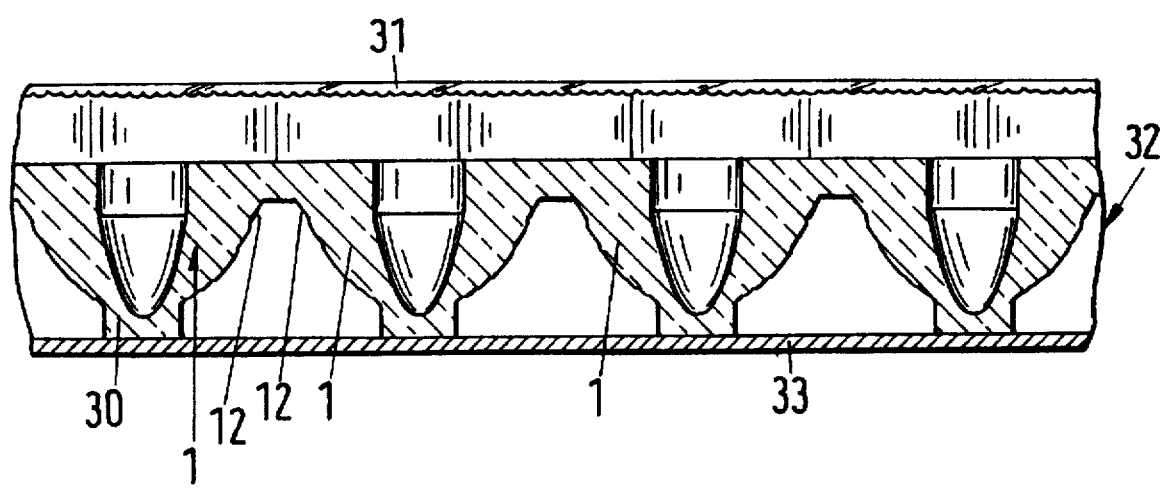
FIG. 4 shows in a longitudinal section a plurality of optical receiving bodies combined to a base structure of a light.

FIG. 4 shows an optical unit comprised of a number of optical members 1 positioned adjacent to one another which are arranged behind the transparent disk (cover plate) 31 of a lamp 32. The individual optical members 1 are of identical construction as disclosed in connection with the embodiment of FIGS. 1 to 3. Advantageously, the optical members 1 are connected so as to form a one-piece (unitary) part as a base structure for a lamp. They have a transition into one another at the reflective surfaces 12. With their cylindrical projections 30 they rest at a back wall 33 of the lamp and can be connected thereto with an adhesive. Each of the optical members contains one LED. The optical members 1 can be arranged adjacent to one another in the horizontal or vertical direction. Due to the aforementioned high light efficiency the light emitted by the individual LEDs acts to uniformly illuminate the surface of the lamp so that from the exterior it is not detectable that the emitted light penetrating the cover plate 31 is emitted by individual LEDs 2. The cover plate 31 is thus uniformly illuminated over its entire surface area.

The illuminated disk (cover plate) 31 can be colored, for example, so as to produce red light when the light 32 is to be used a brake light. However, it is also possible to embody the individual LEDs 2 such that they emit red light and to leave the cover plate 31 uncolored.

The present invention is, of course, in no way restricted to the specific disclosure of the specification and drawings, but also encompasses any modifications within the scope of the appended claims.

What we claimed is:

1. An optical receiving body for at least one LED, said optical receiving body comprising:
   an optical member having a receiving chamber for receiving the at least one LED emitting light in a main direction of light emission;
   said receiving chamber having an inner wall comprising a parabolic wall section;
   said parabolic wall section being a first reflective surface for light beams emitted by the at least one LED;
   wherein the light beams are partly refracted at said parabolic wall section to refracted light beams;
   wherein said optical member comprises at least one second reflective surface, wherein the refracted light beams impact on said at least one second reflective surface to be reflected in a main direction of light emission; and
   wherein said optical member has an exterior surface and wherein said at least one second reflective surface is located at said exterior surface.

2. An optical receiving body according to claim 1, wherein said optical member has an end face extending perpendicularly to said main direction of light emission and wherein the reflected light beams and the refracted light beams exit through said end face.

3. An optical receiving body according to claim 2, wherein the light beams penetrating said optical member are refracted upon passing through said end face.

4. An optical receiving body according to claim 2, wherein said receiving chamber has an outlet opening for the light within said end face and wherein said end face comprises at least one conical surface surrounding said outlet opening.

5. An optical receiving body according to claim 1, wherein said exterior surface is at least partially metal-coated to form said at least one reflective surface.

6. An optical receiving body according to claim 1, wherein a plurality of said second reflective surfaces are arranged at said exterior surface one after another in an axial direction of said optical member.

7. An optical receiving body according to claim 1, wherein said at least one second reflective surface is conically shaped.

8. An optical receiving body according to claim 1, wherein said at least one second reflective surface is parabolically shaped.

9. An optical receiving body according to claim 1, wherein said at least one second reflective surface is free-formed.

10. An optical receiving body according to claim 1, wherein said at least one second reflective surface is parabolically shaped and free-formed.

11. An optical receiving body according to claim 1, wherein said optical member is substantially cone-shaped.

12. An optical receiving body according to claim 11, wherein said optical member widens in said main direction of light emission.

13. An optical receiving body according to claim 1, wherein said optical member is comprised of transparent material.

14. An optical receiving body according to claim 13, wherein said optical member is comprised of plastic material.

* * * * *